(12) United States Patent
Schwantes et al.

(10) Patent No.: US 7,848,070 B2
(45) Date of Patent: *Dec. 7, 2010

(54) ELECTROSTATIC DISCHARGE (ESD) PROTECTION STRUCTURE AND A CIRCUIT USING THE SAME

(75) Inventors: Stefan Schwantes, Heilbronn (DE); Michael Graf, Leutenbach (DE); Volker Dudek, Brackenheim (DE); Gayle W. Miller, Jr., Colorado Springs, CO (US); Irwin Rathbun, Colorado Springs, CO (US); Peter Grombach, Heilbronn (DE); Manfred Klaussner, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/177,061

(22) Filed: Jul. 21, 2008

(65) Prior Publication Data

US 2008/0278874 A1    Nov. 13, 2008

Related U.S. Application Data

(63) Continuation of application No. 11/254,387, filed on Oct. 20, 2005, now Pat. No. 7,402,846.

(51) Int. Cl.
*H02H 9/00* (2006.01)
(52) U.S. Cl. ....................................................... 361/56
(58) Field of Classification Search .................... 361/56
See application file for complete search history.

(56) References Cited

U.S. PATENT DOCUMENTS

| | | | |
|---|---|---|---|
| 5,977,595 A | 11/1999 | Ham | |
| 6,323,074 B1 | 11/2001 | Jiang et al. | |
| 6,462,384 B2 | 10/2002 | Kwon | |
| 6,573,568 B2 | 6/2003 | Lin et al. | |
| 6,614,633 B1 | 9/2003 | Kohno | |
| 6,664,599 B1 | 12/2003 | Chen et al. | |
| 6,682,993 B1 | 1/2004 | Wu et al. | |
| 6,720,623 B2 | 4/2004 | Chen | |
| 6,794,715 B1 | 9/2004 | Liu et al. | |
| 6,815,775 B2 | 11/2004 | Ker et al. | |
| 6,815,776 B2 | 11/2004 | Lee et al. | |
| 6,835,623 B2 | 12/2004 | Shiau et al. | |
| 6,835,627 B1 | 12/2004 | Whiston et al. | |
| 6,858,901 B2 | 2/2005 | Ker et al. | |
| 6,898,062 B2 | 5/2005 | Russ et al. | |
| 7,141,831 B1 | 11/2006 | Vashchenko et al. | |
| 7,402,846 B2 * | 7/2008 | Schwantes et al. | .......... 257/202 |
| 2004/0075145 A1 | 4/2004 | Shibib | |
| 2004/0178453 A1 | 9/2004 | Duvvury et al. | |
| 2005/0179087 A1 | 8/2005 | Lin et al. | |

* cited by examiner

*Primary Examiner*—Stephen W Jackson
(74) *Attorney, Agent, or Firm*—Schwegman, Lundberg & Woessner, P.A.

(57) ABSTRACT

An electrostatic discharge (ESD) protection structure is disclosed. The ESD protection structure includes an active device. The active device includes a plurality of drains. Each of the drains has a contact row and at least one body contact row. The at least one body contact row is located on the active device in a manner to reduce the amount of voltage required for triggering the ESD protection structure.

20 Claims, 14 Drawing Sheets

ELECTROSTATIC DISCHARGE (ESD) PROTECTION STRUCTURE AND A CIRCUIT USING THE SAME

This application is a Continuation of U.S. patent application Ser. No. 11/254,387, filed on Oct. 20, 2005 now U.S. Pat No. 7,402,846, which is incorporated herein by reference in its entirety.

FIELD OF THE INVENTION

The present invention relates generally to integrated circuits and more particularly to an electrostatic discharge (ESD) protection structure utilized with such circuits.

BACKGROUND OF THE INVENTION

Devices are utilized extensively in integrated circuits to protect the circuits from electrostatic discharge (ESD) events. Hereinafter these types of devices will be referred to as ESD protection structure. Besides the strength of the ESD protection structure, the most important parameter of the device is a triggering voltage (VT1) of the ESD protection structure. To describe the importance of this parameter in more detail refer now to the following discussion in conjunction with the accompanying Figures.

FIG. 1 is a first embodiment of a lateral depletion NMOS (LDNMOS) circuit 10 that is utilized as an ESD protection structure. In this embodiment the LDNMOS circuit 10 includes an LDNMOS device 12 in which the gate is coupled to ground and the source and drain are coupled to $V_{DD}$ and ground respectively. FIG. 2 is a second embodiment of an LDNMOS circuit 100 which is utilized as an ESD protection structure. In this embodiment, the LDNMOS circuit 100 includes a LDNMOS device 102 coupled to a plurality of diodes 106, 108 and 110 and also coupled to a resistor 104. As is seen the diode 106, 108 and 110 are coupled between $V_{DD}$ 114 and ground 116. Diodes 106 and 108 in one embodiment could be for example 18 volt diodes and diode 110 is a 6 volt diode. The gate of the LDNMOS device 102 is coupled between diodes 108 and 110. A resistor 104 is coupled between the gate of the LDNMOS device 102 and ground. In this embodiment the LDNMOS circuit 100 comprises an active clamp.

In a preferred embodiment the incoming ESD event is conducted to the LDNMOS device 102. To describe how the ESD protection structure operates to protect an integrated circuit, refer now to the following description in conjunction with the accompanying figures.

FIG. 3 is a top view of a circuit layout of a conventional design of an LDNMOS device 102'. The view includes a multi-finger device with body contact rows 202a-202e next to the source contact rows 204a-204e. This device 102' includes alternating a plurality of source contact rows 204a-204h and body contact rows 202a-202e (SBS) and pluralities of drain contact rows 209a-209d (D) between gates. As is seen, the number of body contact rows 202a-202e is almost equal to the number of drain contact rows 209a-209d. The lower limit of the VT1 is determined by the supply voltage of the integrated circuit. The ESD protection structure does not conduct for voltages equal to or below the supply voltage. Therefore, VT1 must be larger than the supply voltage. The upper limit, on the other hand, is related to the breakdown voltage of the weakest device connected to the integrated circuit. VT1 must be lower than the breakdown voltage of this device 102. Otherwise, the device 102 is physically damaged during an ESD event.

Typically in a 0.35 μm smart power technology, the supply voltage is 25V and the breakdown voltage of the weakest device is 43V. Hence, for this type of technology, VT1 must be between 25V and 43V in order to guarantee a proper ESD protection. The device 102 shown in FIG. 3 does not operate effectively to provide ESD protection in this range. To describe the problem with a conventional ESD LDNMOS device, refer now to the following.

FIG. 4 is a cut away side view of the layout of the conventional LDNMOS device 102 of FIG. 3. FIG. 4A is a circuit schematic representation of the conventional LDNMOS device 102 of FIG. 4. To explain the operation of LDNMOS device 102 refer now to the following.

Referring to both FIGS. 4 and 4n, in the conventional design as is seen, there are a plurality of drains 206a-206h which receive the ESD event. This event can range from 0 volts to as high as 70 volts using this conventional technology. As is further seen, there are about as many source contacts 204a-204h as drain contact rows 209a-209d (FIG. 4).

In case of an ESD event the inherent parasitic bipolar device of the lateral DMOS transistor will bear the brunt of the current. This bipolar transistor—comprising the NDMOS' drain as collector, body as base and source as emitter—is triggered by impact ionisation. Carriers are generated inside the NDMOS' drain region when a large voltage with respect to the body is applied to the drain contact. The generated holes will travel to the next body contact row. In FIG. 4n, the body contact rows 202a-202d are depicted as conductors. The source-to-body diode will start to conduct a large current, if the voltage drop caused by this hole current below the source contact exceeds approximately 650 mV with respect to the source. This triggers the bipolar device and the drain voltage drops significantly. This phenomenon is referred to as snapback.

FIG. 5 shows the transmission line phasing (TLP) measurement for an active clamp with a multi-finger LDNMOS transistor using the conventional design of FIGS. 3 and 4. For the typical ESD device shown in FIGS. 3 and 4, the triggering voltage (VT1) exceeds the critical voltage of 43V for 0.35 μm smart technology. For example, the triggering voltage would be as high as 70 volts when utilizing the conventional LDNMOS device 102.

Accordingly, what is needed is an ESD protection structure in which the triggering voltage is reduced for certain applications. The ESD protection structure must be cost effective, simple to implement and adaptable to existing integrated circuits. The present invention addresses such a need.

SUMMARY OF THE INVENTION

An electrostatic discharge (ESD) protection structure is disclosed. The ESD protection structure comprises an active device. The active device includes a plurality of drains. Each of the drains has a contact row and at least one body contact row. The at least one body contact row is located on the active device in a manner to reduce the amount of voltage required for triggering the ESD protection structure.

A system and method in accordance with the present invention utilizes a LDNMOS transistor as ESD protection element with optimised substrate contacts. The ratio of substrate contact rows to drain contact rows is smaller than one (1) in order to reduce the triggering voltage of the inherent bipolar transistor.

DETAILED DESCRIPTION

The present invention relates generally to integrated circuits and more particularly to an electrostatic discharge protection structure utilized with such circuits. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Applicants have discovered that the drain voltage required for snapback depends on the amount of carriers and on the distance the carriers have to travel. A larger drain voltage results in an increased amount of carriers. Therefore, the voltage drop caused by these carriers increases. A longer distance is equivalent to a larger resistance seen by the carriers. Therefore, fewer carriers and a smaller drain voltage are needed for the triggering. A system and method in accordance with the present invention utilizes a lateral DNMOS transistor as ESD protection element with contact rows that are optimized to minimize the triggering voltage of the protection structure. In a preferred embodiment the ratio of substrate contact rows to drain contact rows is smaller than one (1) in order to reduce the triggering voltage of the inherent bipolar transistor.

To describe the features of the present invention in more detail, refer now to the following description in conjunction with the accompanying figures.

Figure 1:
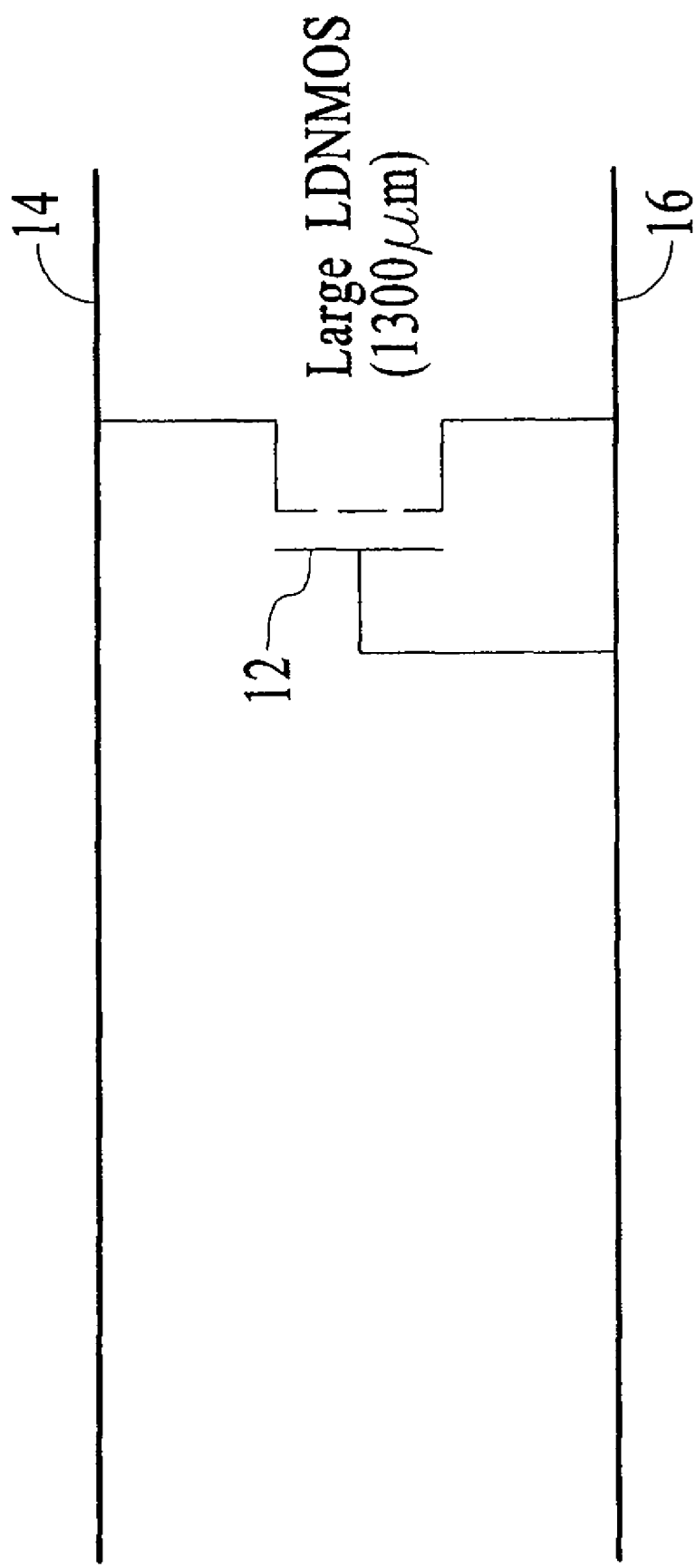
FIG. 1 is a first embodiment of a lateral depletion NMOS (LDNMOS) circuit that is utilized as an ESD protection structure.
Figure 2:
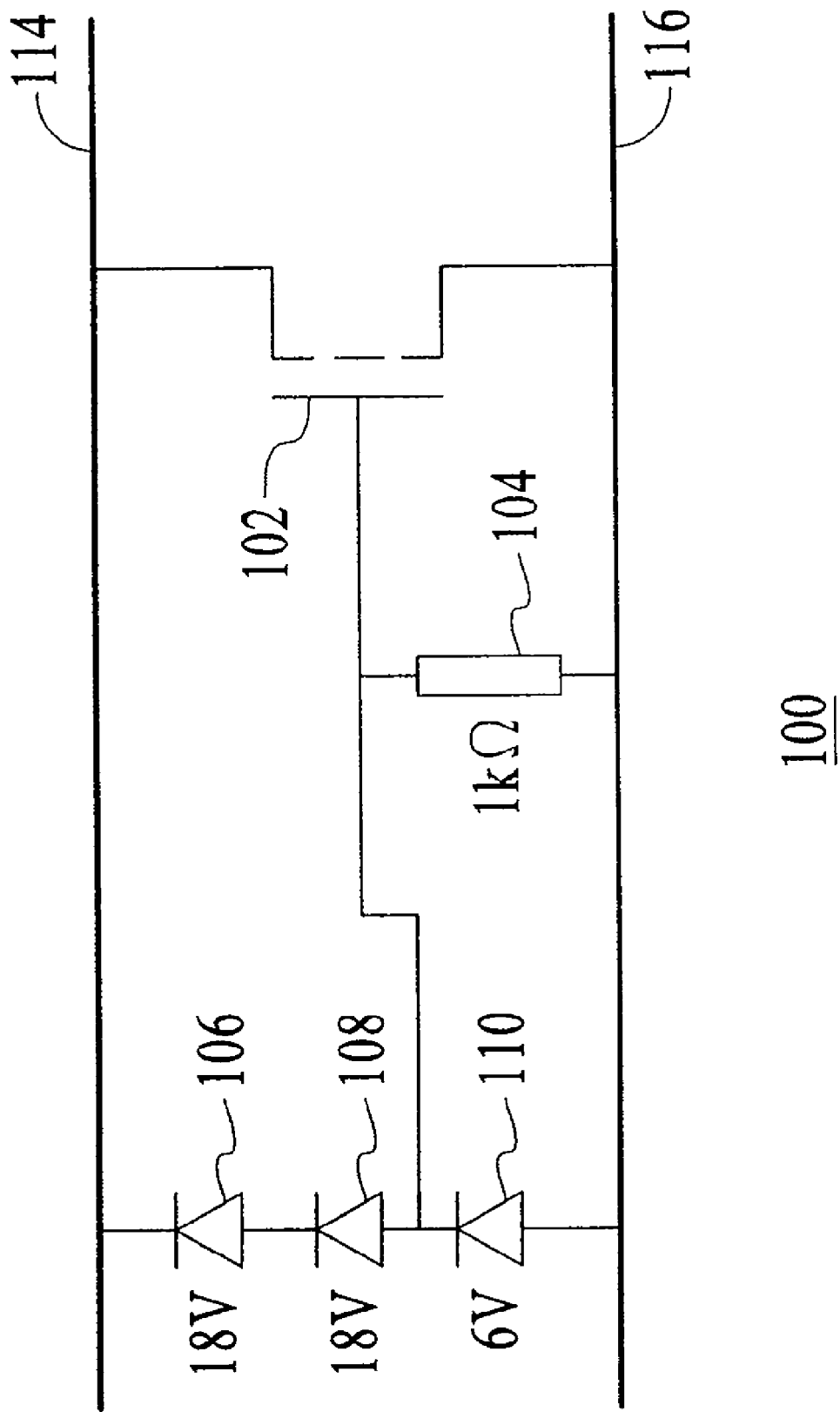
FIG. 2 is a second embodiment of an LDNMOS circuit which is utilized as an ESD protection structure.
Figure 3:
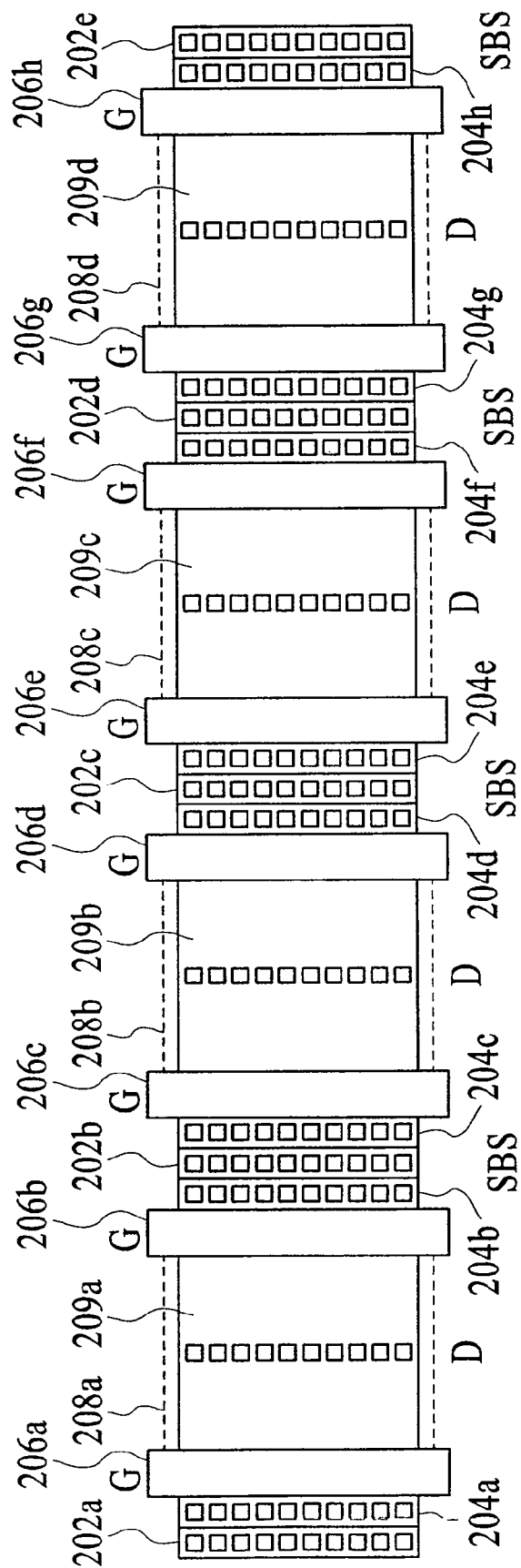
FIG. 3 is a top view of a circuit layout of a conventional design of an LDNMOS device.
Figure 4:
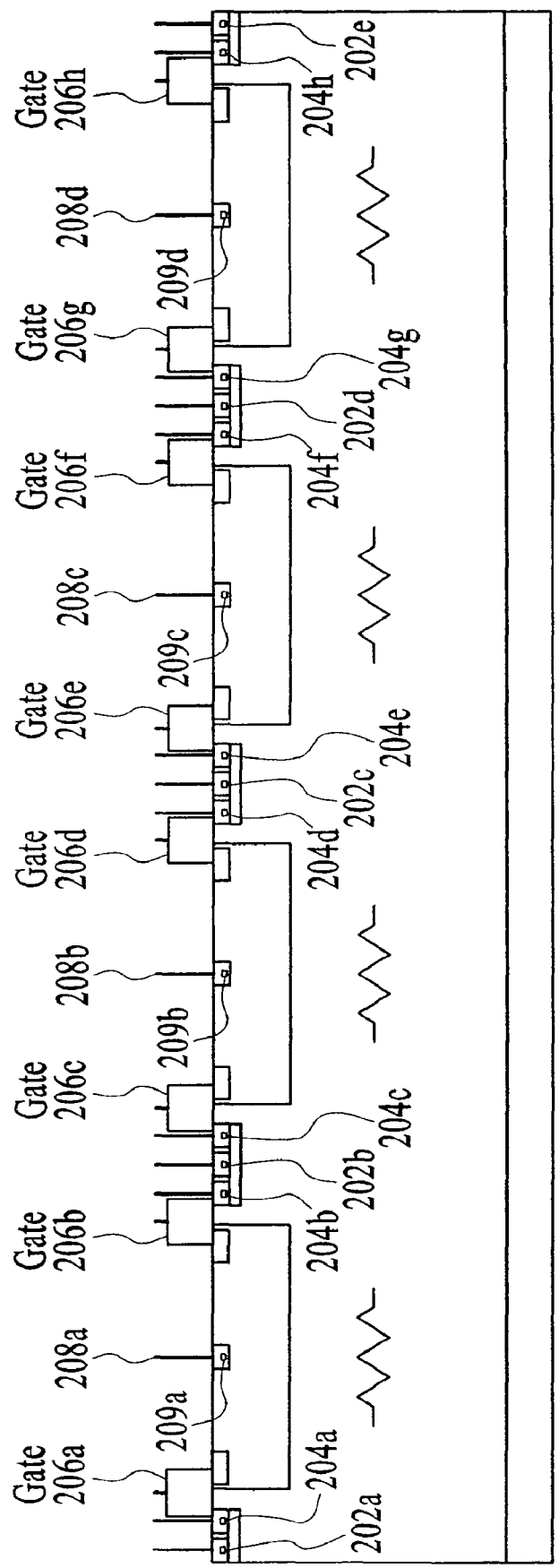
FIG. 4 is a cut away side view of the layout of the conventional LDNMOS device of FIG. 3.
Figure 4A:
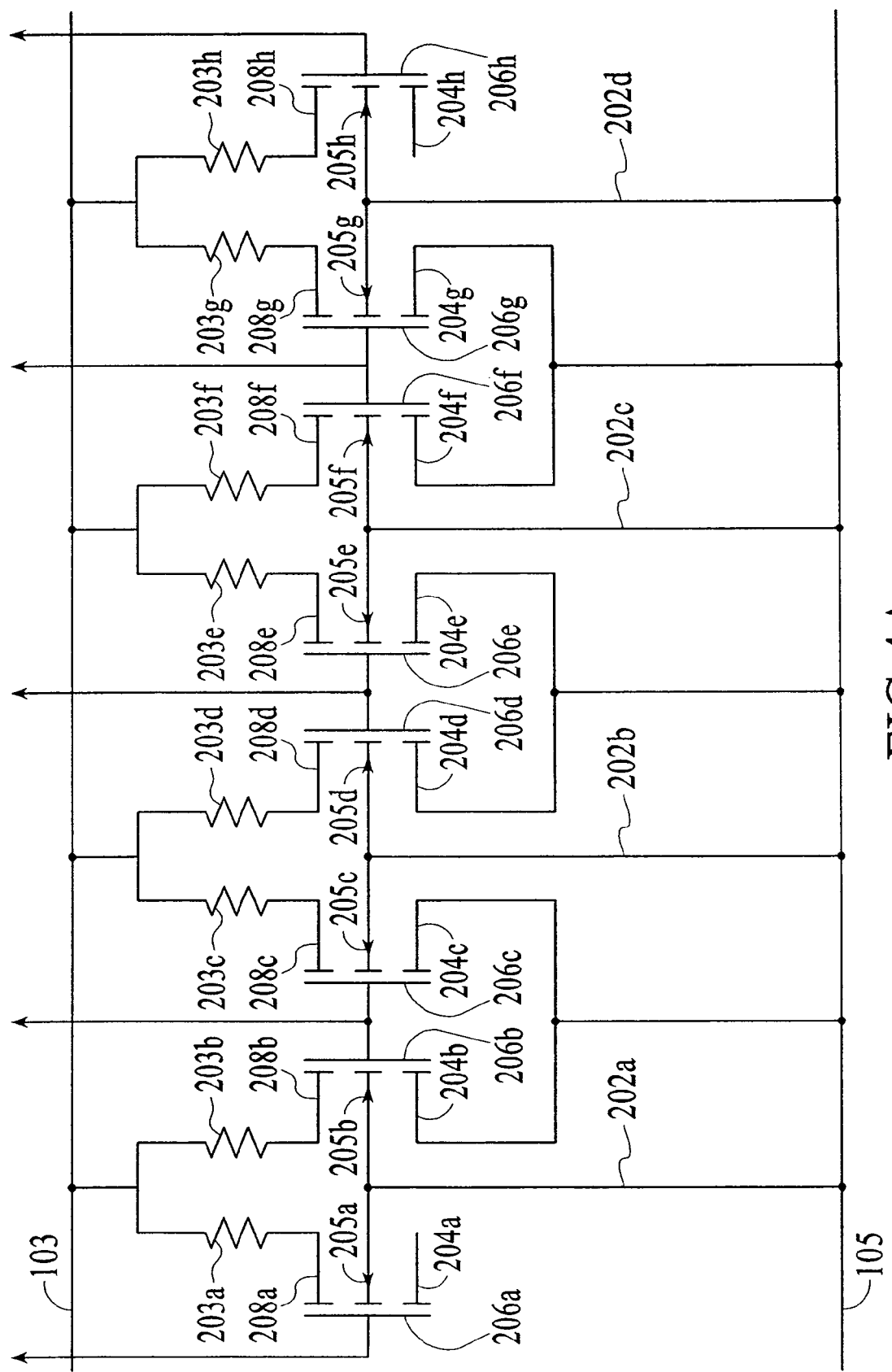
FIG. 4A is a circuit schematic representation of the conventional LDNMOS device of FIG. 4.
Figure 6:
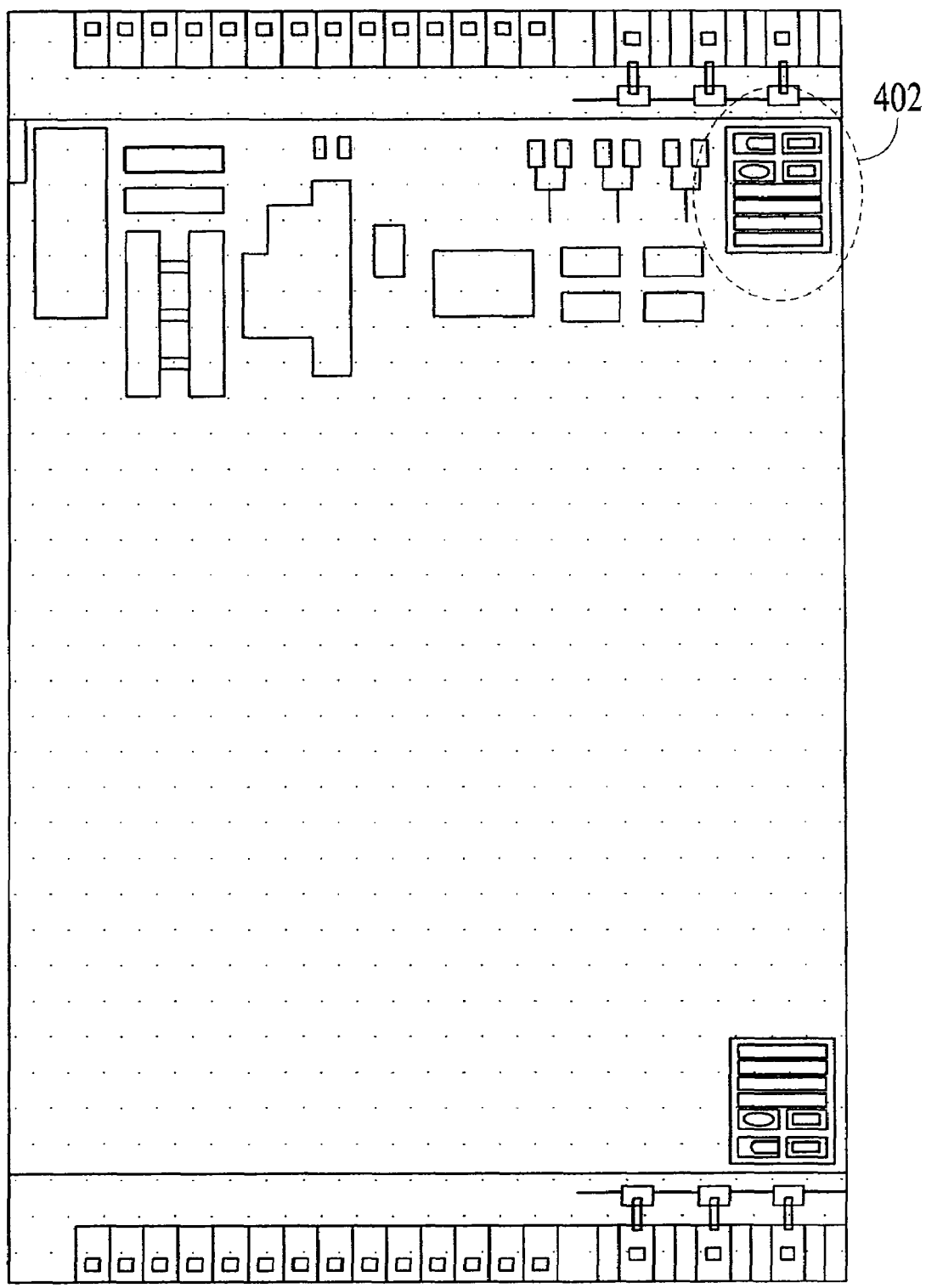
FIG. 6 shows a layout for an integrated circuit.

FIG. 6 shows a layout 400 for an integrated circuit. In this embodiment the circuit includes circuitry for providing a function including, but not limited to an AC/DC converter, an amplifier and a line driver. The circled portion 402 comprises the ESD protection structure which is an integral element of the integrated circuit. The ESD protection structure 402 from a circuit standpoint is identical to circuit schematic of FIG. 2. The critical difference is that the structure of the LDNMOS device shown in FIGS. 3 and 4 is different from the structure of the LDNMOS device on the present invention.

The LDNMOS device in accordance with the present invention is optimized to minimize the voltage needed to protect the devices. This optimization will be described in more detail hereinafter.

Figure 7:
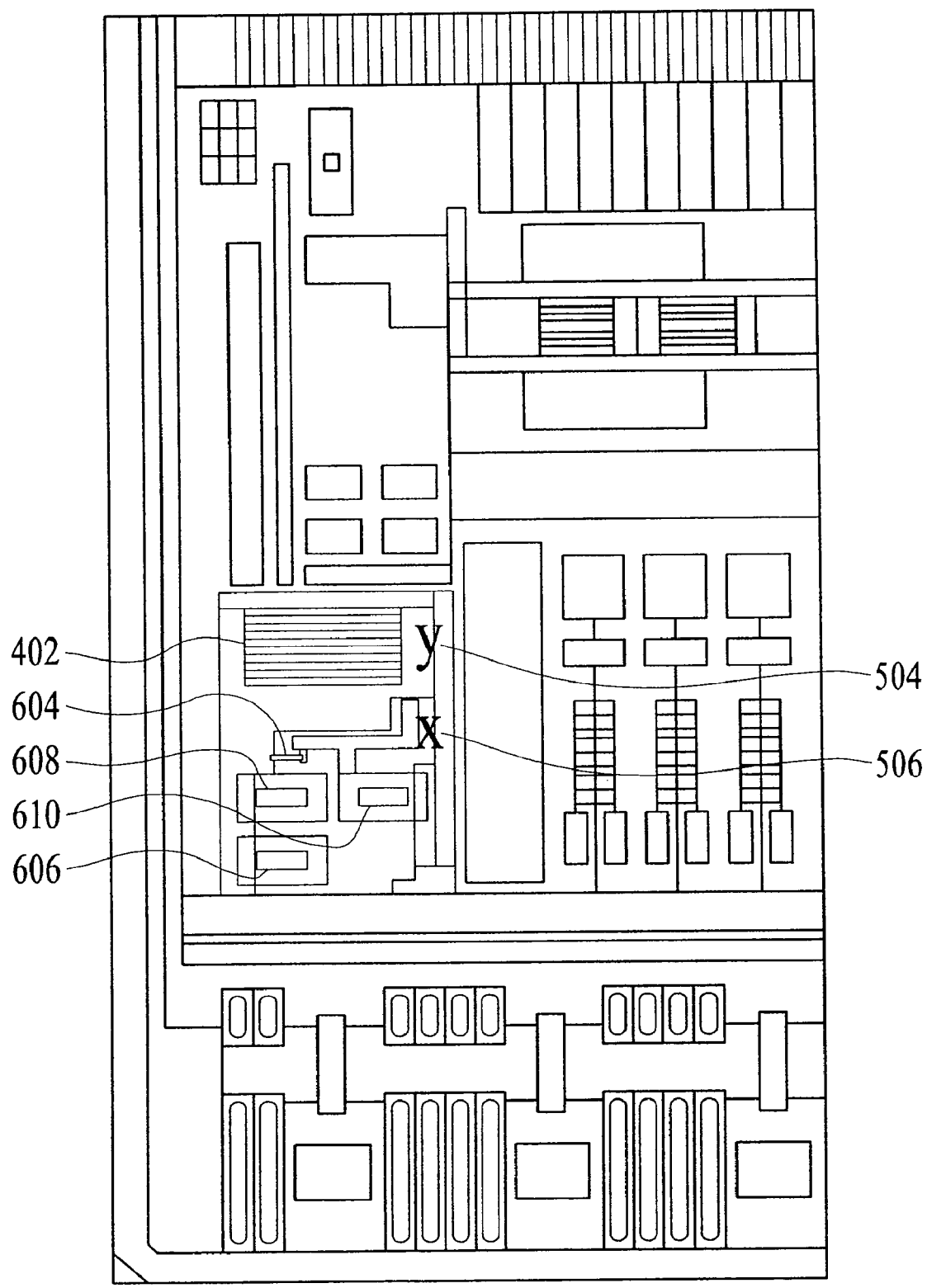
FIG. 7 is an enlarged view of the ESD protection structure of FIG. 6.

FIG. 7 is an enlarged view of the ESD protection structure 402 of FIG. 6. The portion marked 504 is the electrical ground connection to the ESD protection structure 402 (as shown in FIG. 2). The portion marked 506 is the $V_{DD}$ connection to the ESD protection structure 402.

Figure 8:
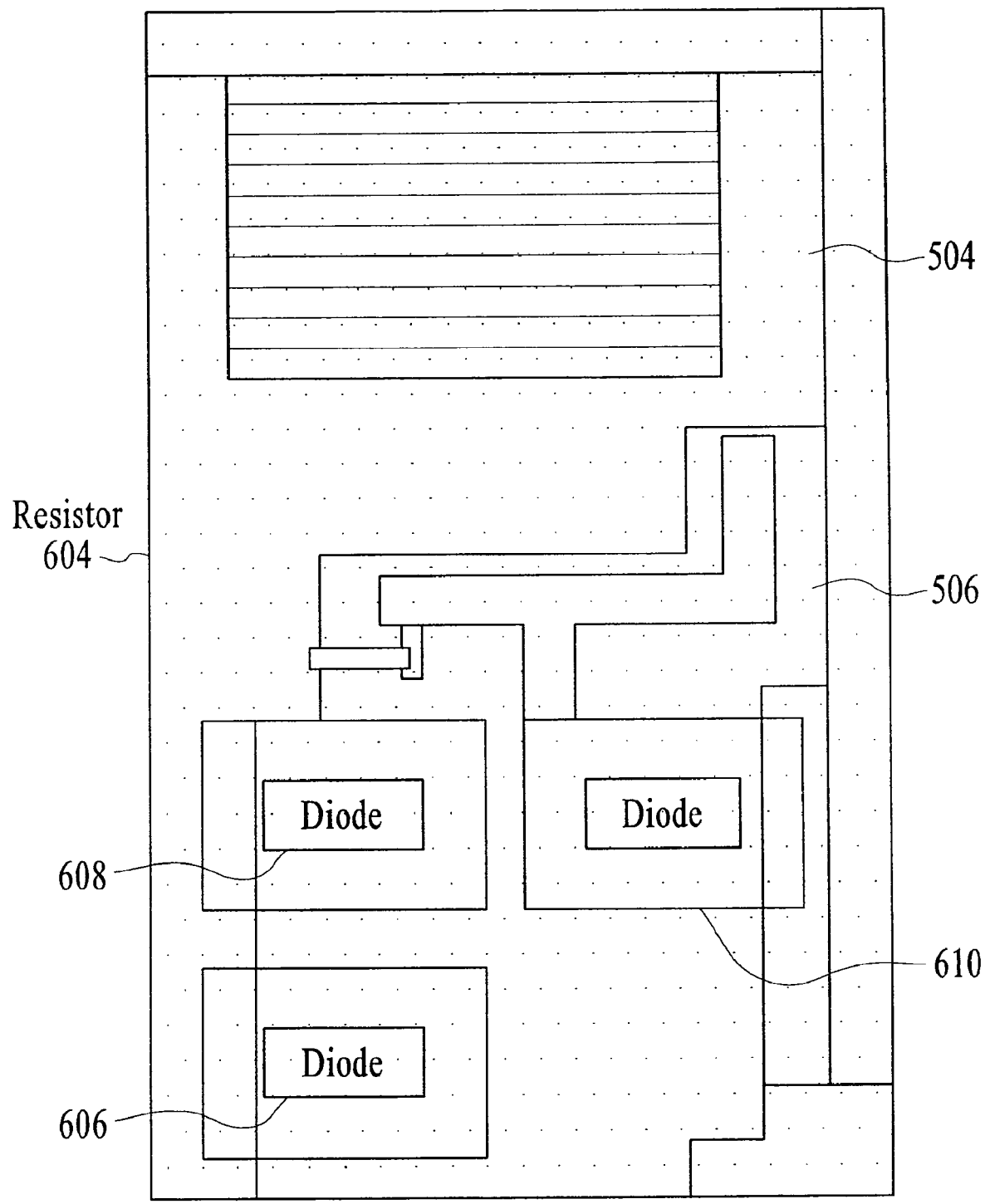
FIG. 8 illustrates a further view of a die plot section of the ESD protection structure.

FIG. 8 illustrates a further enlarged view of a die plot section of the ESD protection structure 402. As is seen, the LDNMOS device is coupled to the ground 105 and $V_{DD}$ 103 (typically 25 to 35 volts). Resistor 604 is coupled between ground and the gate of the LDNMOS device and a plurality of diodes 604, 606 and 608 are coupled to the gate of the LDNMOS device and between $V_{DD}$ and ground.

Figure 9:
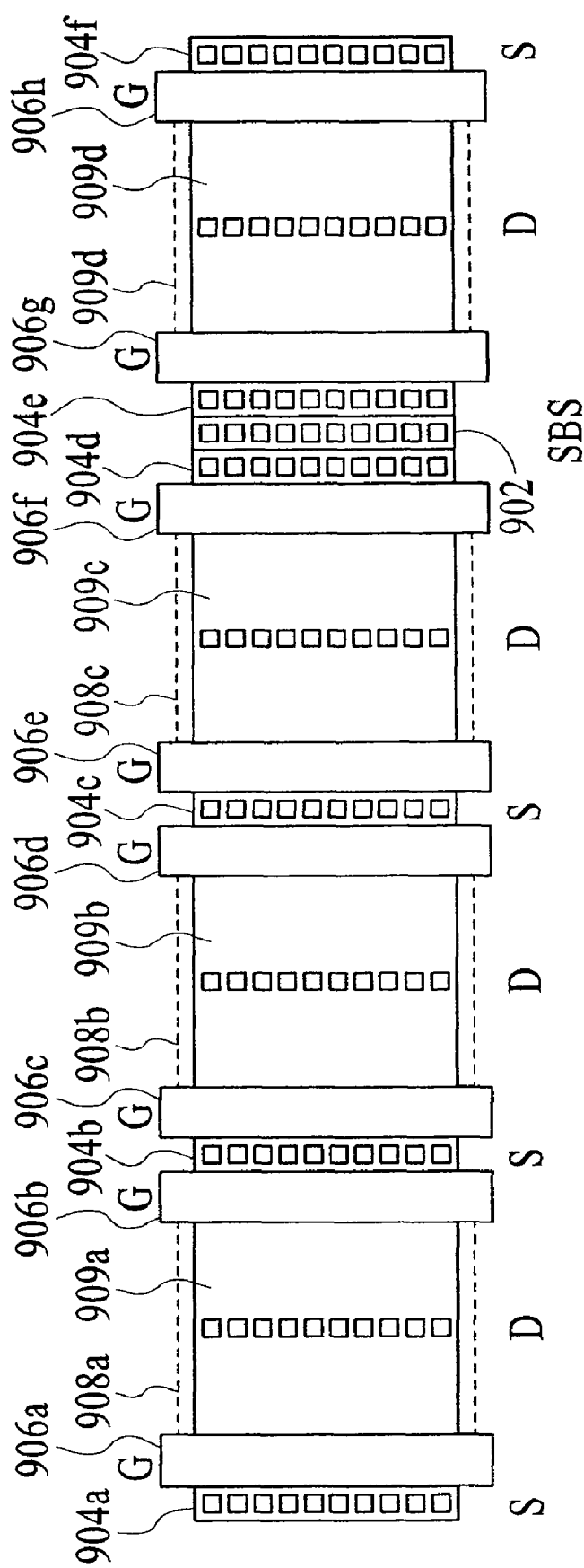
FIG. 9 is a top view of a circuit layout of an LDNMOS device in accordance with the present invention.
Figure 10A:
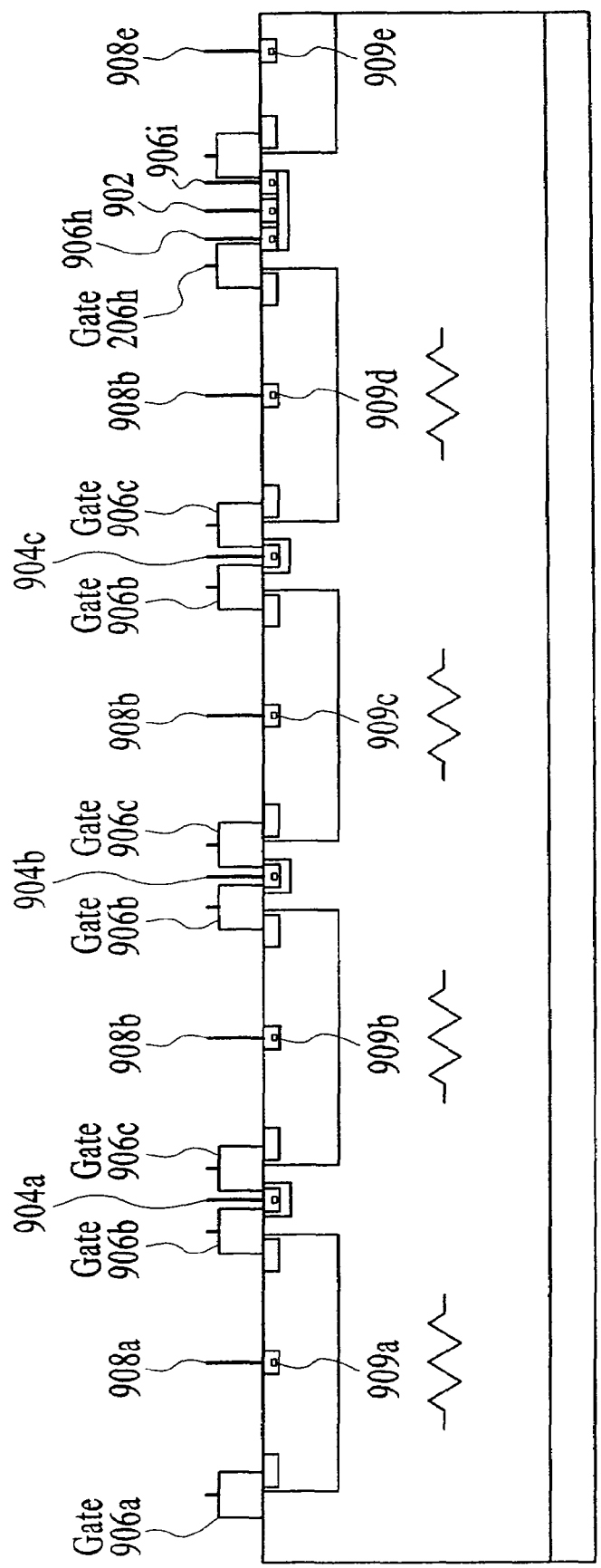
FIG. 10A is a cut away side view of the LDNMOS circuit of FIG. 9.

FIG. 9 is a top view of a circuit layout of an LDNMOS device in accordance with the present invention. FIG. 10A is a cut away side view of the LDNMOS circuit of FIG. 9. Referring to both FIGS. 9 and 10A together in a preferred embodiment, a reduced number of body contact rows 902, in this case, one is provided (shown in FIG. 9) and the body contact row 902 is spaced a significant distance away from the drain contact rows 909a-909d such that voltage required to trigger the device is reduced. For 0.35 µm smart power technology the ratio of drain contact rows to body contact rows is 4:1 for optimum performance. One of ordinary skill in the art recognizes that a variety of other ratios could be utilized and be within the spirit and scope of the present invention. The hole current has to travel a longer distance to the substrate ties, and the total hole current underneath the source contacts is larger (FIG. 10) than for the conventional design (FIG. 4). It should also be noted that the substrate rows to drain rows ratio also has an impact on the DC breakdown voltage of the LDNMOS device. If the number of contact rows is reduced, the DC breakdown voltage of the LDNMOS transistor is reduced also. Therefore, a minimum number of substrate contact rows are required. To describe this feature in more detail refer now to the following discussion in conjunction with the accompanying Figures.

Figure 10B:
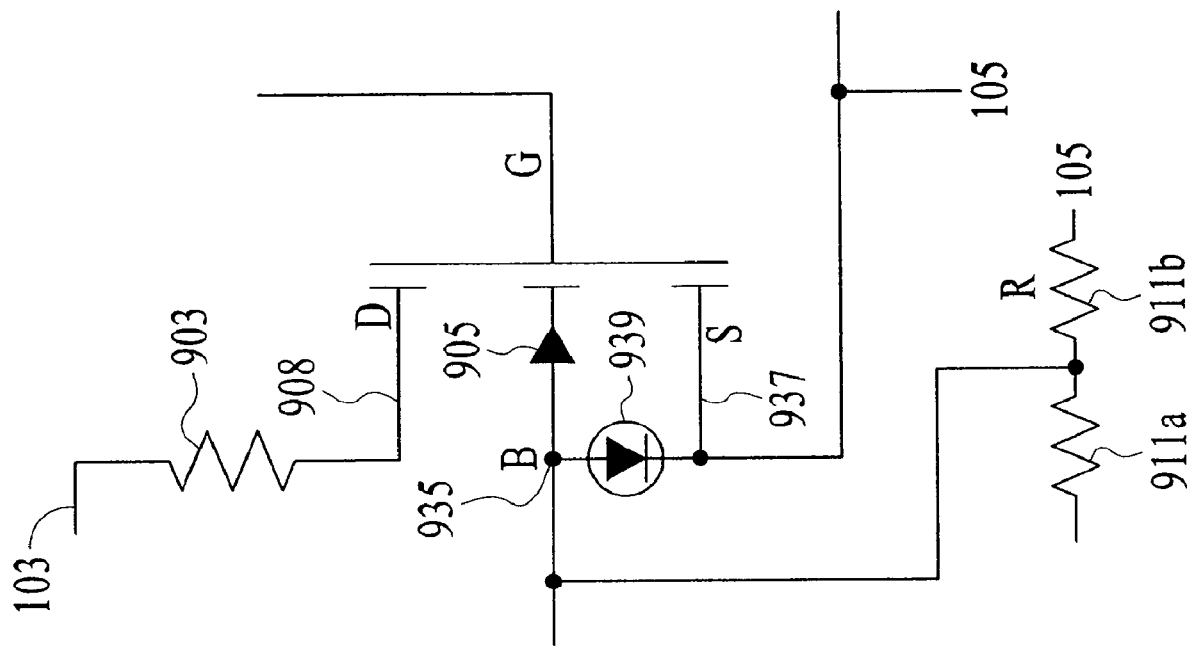
FIG. 10B is a circuit schematic of one finger of an LDNMOS protection device.

FIG. 10B is a circuit schematic of one finger 950 of an LDNMOS protection device in accordance with the present invention. The resistance 911a and 911b between node 935 and ground increases as a finger is further removed from a body contact row. As the resistance 911a and 911b increases, the device can be triggered when lower voltages are applied to $V_{DD}$. The resistance 911a and 911b represent the removal of body contact rows from the LDNMOS device 902.

Due to added resistance circuit element 911a and 911b, the voltage on node 935 becomes more positive. As the high voltage, applied to the entire circuit via $V_{DD}$, increases, the hole current increases, as does the positive voltage at node 935.

The positive voltage at node 935 eventually becomes greater than the voltage at the source terminal 937 of the LDNMOS device, which forward biases parasitic diode 939, an internal part of the LDNMOS device.

Current flows from the source to ground, which limits the rate of increase of voltage on node $V_{DD}$. This current flows from the drain, through the source terminal 937 to ground, and is multiplied by the current gain of the parasitic lateral bipolar device formed by the drain, body, and source diffusions of the LDNMOS device.

Figure 10C:
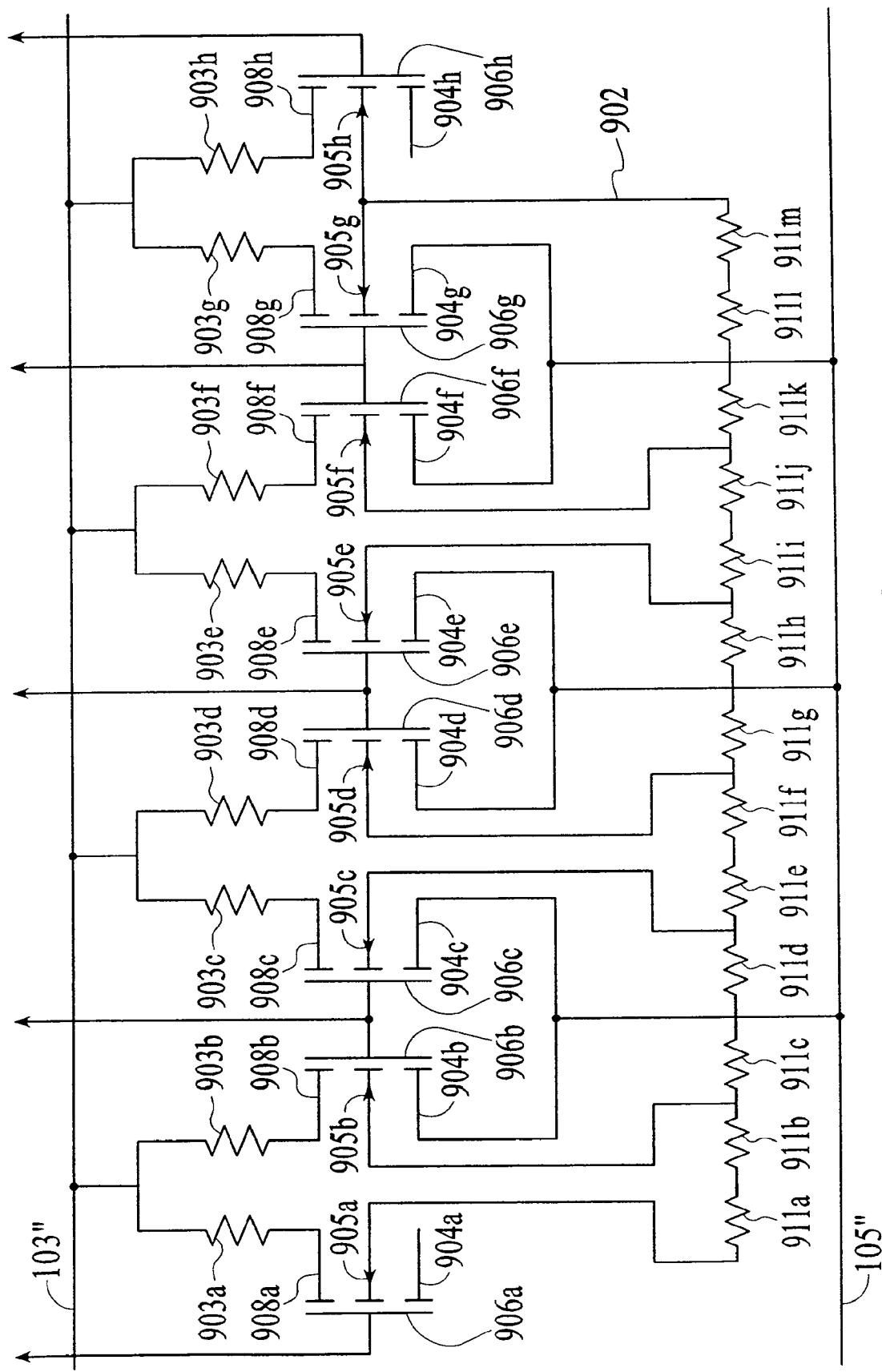
FIG. 10C is a circuit schematic of an LDNMOS device in accordance with the present invention.

FIG. 10C is a circuit schematic of an LDNMOS 402 device in accordance with the present invention. As is seen, a plurality of resistances 911a-911m is provided that is coupled to the body contact row 902. In so doing, a lower voltage is required to trigger the ESD protection.

Figure 5:
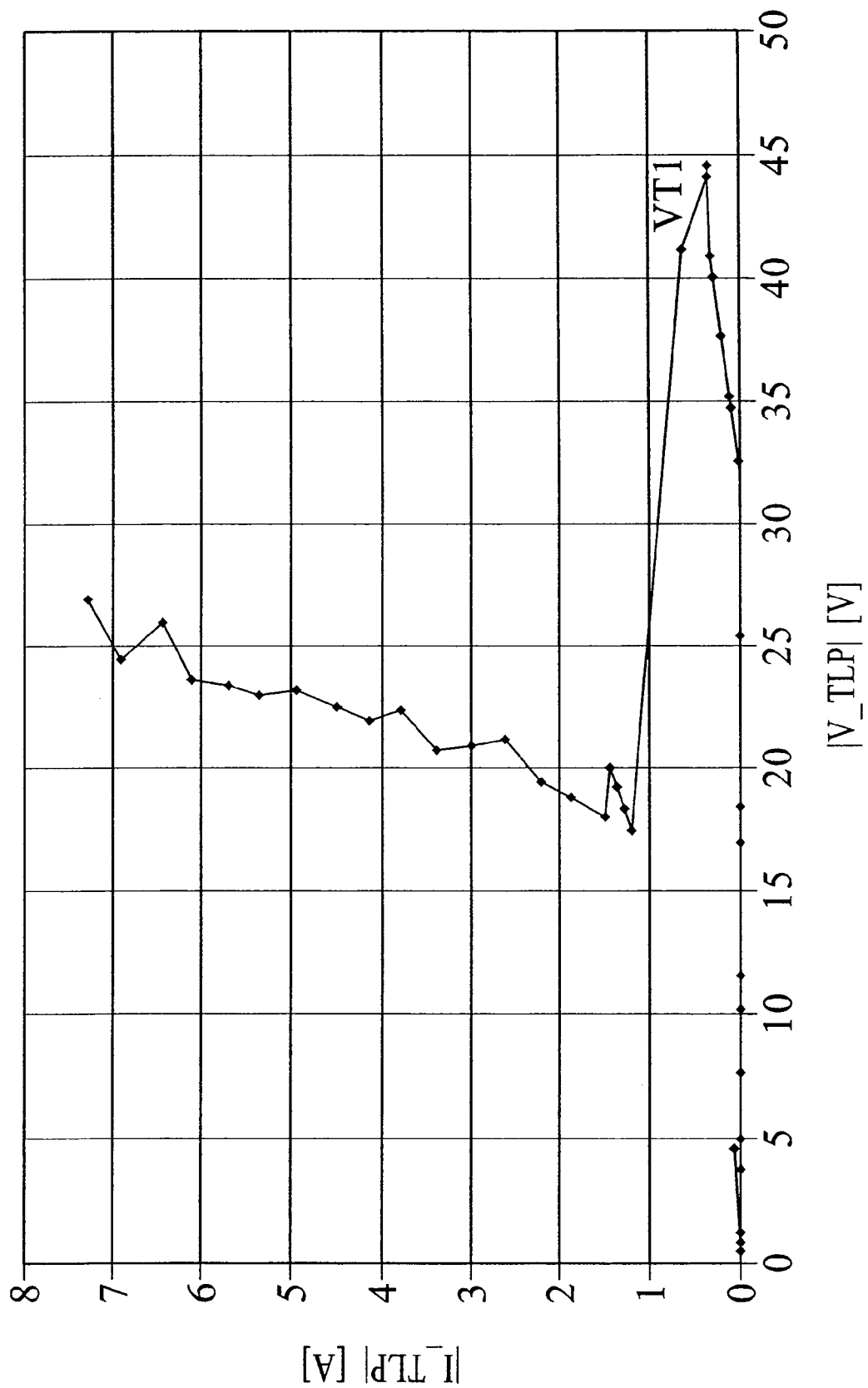
FIG. 5 shows the TLP measurement for an active clamp using a LDNMOS transistor using the conventional design of FIGS. 3 and 4.
Figure 11:
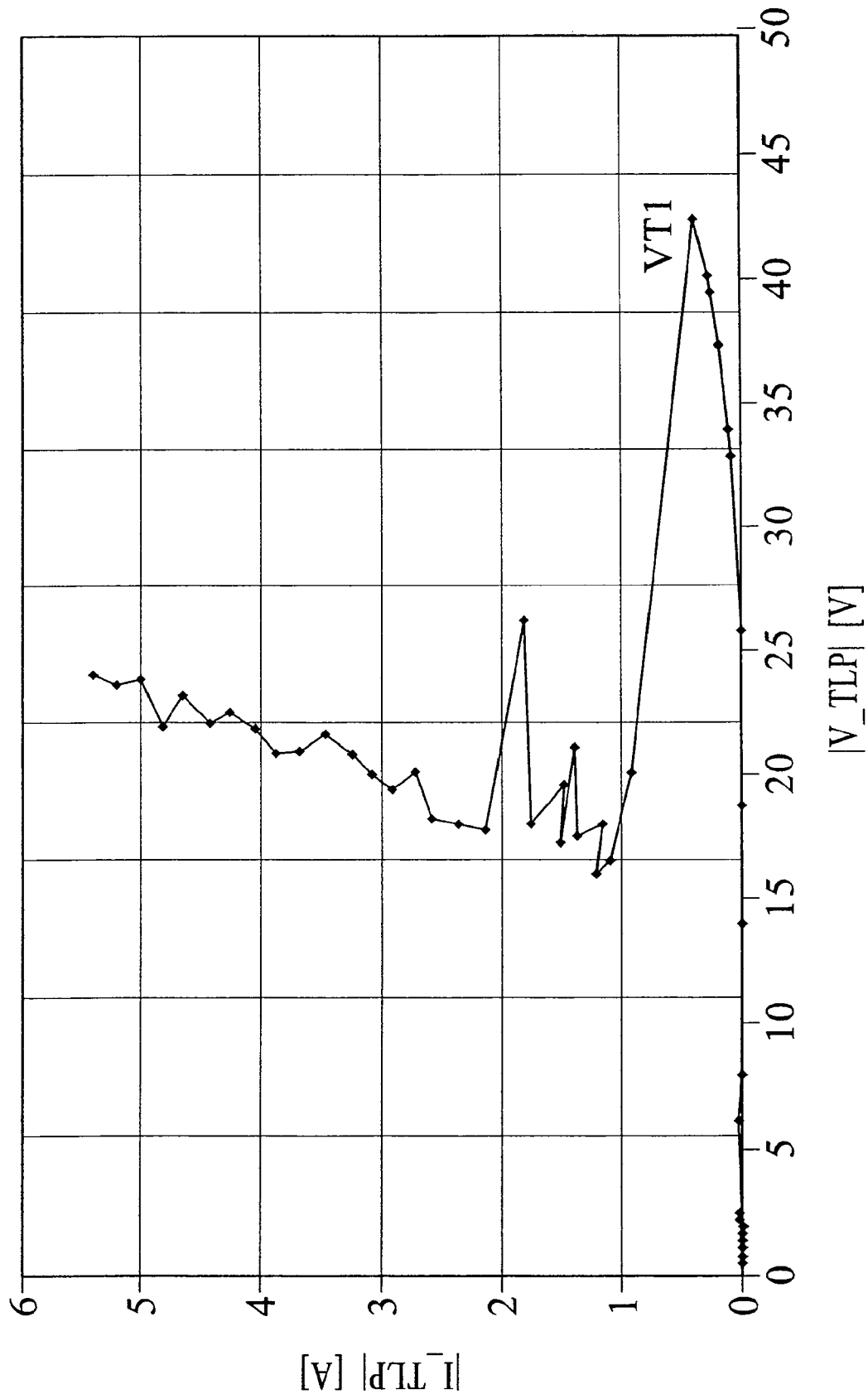
FIG. 11 shows the TLP measurement for an active clamp using a LDNMOS device in accordance with the present invention.

The TLP measurement for the improved design in accordance with the present invention is shown in FIG. 11. As is seen, triggering voltage (VT1) is clearly reduced compared to the triggering voltage of the conventional device shown in FIG. 5.

In this particular technology, an LDNMOS device will breakdown at 30V. As before mentioned in the conventional design shown in FIG. 5, the triggering voltage could be as high as 70 volts. In a preferred embodiment, the drain row to substrate row ratio is 4:1 and a distance of the travel of the holes from the drain rows to the body row contact depends on the resistivity of the body doping for the LDNMOS transistor. Typically the device would be designed with a distance of 5 to 20 microns for a "finger" with minimum substrate biasing sensitivity. To improve the sensitivity of the device, the fingers would be spaced from 20 microns, to as much as 200 microns (or more from the substrate contact. This ratio and distance is sufficient keeping in mind that the supply voltage is 25V. However, a larger ratio would not only further reduce VT1 but also the DC breakdown voltage of the LDNMOS device. Thus for this technology, 4:1 is the optimum ratio for this device.

A system and method in accordance with the present invention provides an ESD protection element with optimised substrate contacts. The ratio of substrate contact rows to drain contact rows is smaller than one (1) in order to reduce the triggering voltage of the inherent bipolar transistor.

Although the present invention has been described in accordance with the embodiments shown, one of ordinary skill in the art will readily recognize that there could be variations to the embodiments and those variations would be within the spirit and scope of the present invention. For example, although the present invention has been described in the context of a LDNMOS device, one of ordinary skill recognizes a group of active devices such as LDNMOS or LDPMOS with all of its parasitic devices can be utilized as ESD protection structure and their use would be within the spirit and scope of the present invention. For example, the parasitic devices include, but are not limited to, drift region extension of drain, which adds resistance between parasitic drain: body N:P junction and external circuitry, body resistance as disclosed in the present application. Source to body diodes, drain to body diodes and gate capacitors to the body.

In addition other devices can be utilized external to the LDNMOS or the LDPMOS device including, but not limited to integrated diodes, or silicon rectifiers, which protect elements of the ESD protection device itself, like the gate part of the device, from destruction due to over voltage and resistors, which used in combination with the diodes, protect elements of the ESD protection circuit itself from peak transient voltages and current. Furthermore, it is understood by one of ordinary skill in the art that although for the technology described in the present application, approximately a 4:1 ratio is drain contact rows to body contact rows is optimal many other ratios could be provided and may be effective for placing the triggering voltage in a desired range. For example, the ratio could be as low as 2:1 and as great as 100:1 and their use would be within the spirit and scope of the present invention.

Accordingly, many modifications may be made by one of ordinary skill in the art without departing from the spirit and scope of the appended claims.

What is claimed is:

1. An electrostatic discharge (ESD) protection device, comprising:
    a lateral depletion NMOS (LDNMOS) device to operate as an active clamp and comprising a plurality of source contact rows, a plurality of gates abutting the source contact rows; at least one body contact row; a plurality of drains, each of the drains being located between the plurality of gates; each of the drains including at least one drain contact row, and a plurality of resistors coupled to the at least one body contact row to reduce a voltage for protecting the device from an electrostatic discharge;
    a plurality of diodes coupled to the LDNMOS device;
    an additional resistor coupled to the LDNMOS device; and
    an external circuit coupled to the device.

2. The ESD protection device of claim 1, wherein the external circuit is an integrated diode.

3. The ESD protection device of claim 1, wherein the external circuit is a silicon rectifier.

4. A method for improving an electrostatic discharge (ESD) protection structure, the method comprising:
    inserting a first lateral depletion NMOS (LDNMOS) device, the LDNMOS device comprising a drain contact row and a substrate contact row;
    attaching a body of the first LDNMOS device to resistors;
    inserting a first diode between the body of the first LDNMOS device and the resistors; and
    inserting a second diode between the body of the first LDNMOS device and a source of the first LDNMOS device.

5. The method of claim 4 further comprising:
    setting a ratio of a number of drain contact rows of the first LDNMOS device to a number of substrate contact rows of the first LDNMOS device based on a number selected using transmission line phasing measurements, wherein the drain contract row is included in the number of drain contact rows, and the substrate contact row is included in the number of substrate contact rows.

6. The method of claim 5, wherein setting the ratio further comprises setting the number of substrate contact rows to one.

7. A method for improving snapback with an electrostatic discharge (ESD) protection device, the method comprising:
    coupling the ESD protection device to a ground node and a power node;
    setting a DC breakdown voltage of the ESD protection device to a minimum value allowed by a process used to form at least the ESD protection device;
    setting a triggering voltage for the ESD protection device; and
    placing the ESD protection device far away from a source of an ESD event.

8. The method of claim 7, wherein coupling the ESD protection device comprises operating at a differential of 25 to 35 volts from the ground node to the power node.

9. The method of claim 7, wherein setting the DC breakdown voltage comprises setting a ratio of a number of substrate rows of the ESD protection device to a number of drain rows of the ESD protection device.

10. The method of claim 7, wherein setting the triggering voltage comprises adjusting a threshold of the ESD protection device.

11. The method of claim 7, wherein setting the triggering voltage comprises adjusting a resistance on a source of the ESD protection device.

12. The method of claim 11, wherein adjusting the resistance comprises adjusting a resistance of an interconnect between the source of the ESD event and the ESD protection device.

13. The ESD protection device of claim 1, wherein the at least one drain contact row is included in a number of drain contact rows of the ESD protection device, and the least one body contact row is included in a number of body contact rows of the ESD protection device.

14. An electrostatic discharge (ESD) protection structure comprising:
   a lateral depletion NMOS (LDNMOS) device to operate as an active clamp, the LDNMOS device comprising drains, each of the drains having at least one drain contact row, the LDNMOS device further comprising at least one body contact row, and resistors coupled to the at least one body contact row, the resistors configured to reduce a voltage that triggers the ESD protection structure;
   diodes coupled to the LDNMOS device; and
   an additional resistor coupled to the LDNMOS device.

15. The ESD protection structure of claim 14, wherein the at least one drain contact row is included in a number of drain contact rows of the ESD protection structure, and the at least one body contact row is included in a number of body contact rows of the ESD protection structure.

16. The ESD protection structure of claim 15, wherein a ratio of the number of drain contact rows to the number of body contact rows is in a range of approximately 2:1 to 100:1.

17. The ESD protection structure of claim 14, wherein the LDNMOS further comprises a gate, the gate configured to couple to a ground potential.

18. An electrostatic discharge (ESD) protection structure comprising:
   a lateral depletion NMOS (LDNMOS) device to operate as an active clamp, the LDNMOS device comprising:
      source contact rows, gates abutting the source contact rows, and a body contact row sandwiched between two of the source contact rows;
      drains, at least one of the drains being located between the gates, each of the drains comprising a drain contact row; and
      resistors coupled to the body contact row, the resistors configured to reduce a voltage that triggers the ESD protection structure; and
   diodes coupled to the LDNMOS device; and
   an additional resistor coupled to the LDNMOS device.

19. The ESD protection structure of claim 18, wherein the drain contact row is included in a number of drain contact rows of the ESD protection structure, and the body contact row is included in a number of body contact rows of the ESD protection structure.

20. The ESD protection structure of claim 19, wherein a ratio of the number of drain contact rows to the number of body contact rows is approximately 4:1.

* * * * *